(12) United States Patent
Zeng

(10) Patent No.: US 11,699,835 B2
(45) Date of Patent: Jul. 11, 2023

(54) CIRCUIT BOARD AND BATTERY CONNECTION MODULE

(71) Applicant: Molex, LLC, Lisle, IL (US)

(72) Inventor: Shang Xiu Zeng, Chengdu (CN)

(73) Assignee: Molex, LLC, Lisle, IL (US)

( * ) Notice: Subject to any disclaimer, the term of this patent is extended or adjusted under 35 U.S.C. 154(b) by 155 days.

(21) Appl. No.: 16/923,103

(22) Filed: Jul. 8, 2020

(65) Prior Publication Data

US 2020/0343524 A1  Oct. 29, 2020

Related U.S. Application Data

(63) Continuation of application No. 15/842,335, filed on Dec. 14, 2017, now abandoned.

(30) Foreign Application Priority Data

Jan. 9, 2017  (CN) .......................... 201710014976.8

(51) Int. Cl.
*H01M 50/581* (2021.01)
*H05K 1/02* (2006.01)
(Continued)

(52) U.S. Cl.
CPC ....... *H01M 50/581* (2021.01); *H01M 50/507* (2021.01); *H01M 50/51* (2021.01);
(Continued)

(58) Field of Classification Search
CPC .. H01M 50/502; H01M 50/507; H01M 50/51; H01M 50/531; H01M 50/581;
(Continued)

(56) References Cited

U.S. PATENT DOCUMENTS 4,296,398 A    10/1981  McGalliard
2018/0198110 A1  7/2018  Zeng

FOREIGN PATENT DOCUMENTS

CN    102751465 A    10/2012
CN    203691758 U    7/2014
(Continued)

OTHER PUBLICATIONS

Machine translation of JPS56114572U. (Year: 1981).*
(Continued)

*Primary Examiner* — Mayla Gonzalez Ramos

(57) ABSTRACT

A circuit board and a battery connection module are provided. The circuit board has an insulating substrate and a plurality of circuit traces provided thereto. At least one of the traces is provided with a fuse unit. The fuse unit has a main fuse and at least one spare fuse. The main fuse has two main trace connection end portions respectively positioned at two ends of the main fuse and connected to the trace and a main fuse section connected between the two main trace connection end portions. The spare fuse has two trace connection end portions respectively positioned at two ends of the spare fuse and a fuse section connected between the two trace connection end portions, the fuse section and the main fuse section are spaced apart from each other and arranged side by side, and at least one of the two trace connection end portions is not connected with the trace so as to form an electrical disconnection with the trace, and after the main fuse section forms an electrical disconnection, the two trace connection end portions are connected to the trace so that a current conductive path is formed by the spare fuse and the trace.

16 Claims, 11 Drawing Sheets

(51) Int. Cl.
  *H02H 3/08* (2006.01)
  *H01M 50/531* (2021.01)
  *H01M 50/51* (2021.01)
  *H01M 50/507* (2021.01)
  *H02H 7/18* (2006.01)
  *H05K 1/11* (2006.01)
  *H02H 3/04* (2006.01)

(52) U.S. Cl.
  CPC ............ *H01M 50/531* (2021.01); *H02H 3/08* (2013.01); *H05K 1/028* (2013.01); *H05K 1/0293* (2013.01); *H01M 2200/103* (2013.01); *H02H 3/046* (2013.01); *H02H 7/18* (2013.01); *H05K 1/118* (2013.01); *H05K 2201/10037* (2013.01); *H05K 2201/10181* (2013.01)

(58) Field of Classification Search
  CPC ............ H01M 2200/103; H05K 1/028; H05K 1/0293; H05K 1/118; H05K 2201/10037; H05K 2201/10181; Y02E 60/10; H02H 7/18
  See application file for complete search history.

(56) References Cited

FOREIGN PATENT DOCUMENTS

| CN | 203968491 U | | 11/2014 |
|---|---|---|---|
| CN | 204596912 U | | 8/2015 |
| CN | 205621791 U | * | 10/2016 |
| CN | 205621791 U | | 10/2016 |
| JP | S52-128035 U | | 9/1977 |
| JP | S54-159163 U | | 11/1979 |
| JP | S56-114572 U | | 9/1981 |
| JP | S56114572 U | * | 9/1981 |
| JP | S57-57573 U | | 4/1982 |
| JP | S58-24944 U | | 2/1983 |
| JP | S58-27966 U | | 2/1983 |
| JP | S5827966 U | | 2/1983 |
| JP | S59-41887 A | | 3/1984 |
| JP | S61-023169 U | | 2/1986 |
| JP | S62-205603 A | | 9/1987 |
| JP | S62-191155 U | | 12/1987 |
| JP | S63-106160 U | | 7/1988 |
| JP | S6416662 U | | 1/1989 |
| JP | H02-136350 U | | 11/1990 |
| JP | H10199396 A | | 7/1998 |
| JP | 2001309551 A | | 11/2001 |
| JP | 2011-049158 A | | 3/2011 |
| JP | 2013-105522 A | | 5/2013 |
| JP | 2013105571 A | * | 5/2013 |
| JP | 2014-220157 A | | 11/2014 |
| TW | M339766 U | | 9/2008 |
| TW | 201621532 A | | 6/2016 |
| WO | 2012/011237 A1 | | 1/2012 |

OTHER PUBLICATIONS

Machine translation of CN-205621791-U. (Year: 2016).*
Machine translation of JP-2013105571-A. (Year: 2013).*
Notification of Reasons for Refusal received for Japanese Patent Application No. 2017-243438, dated Dec. 18, 2018, 11 pages. (6 pages of English Translation and 5 pages of Official Copy).

* cited by examiner

CIRCUIT BOARD AND BATTERY CONNECTION MODULE

RELATED APPLICATIONS

This application is a divisional of U.S. application Ser. No. 15/842,335, filed Dec. 14, 2017, which claims priority to Chinese Application No. 201710014976.8, filed Jan. 9, 2017, each of which are incorporated herein by reference in its entirety.

TECHNICAL FIELD

The present disclosure relates to a circuit board, and particularly relates to a printed circuit board and a battery connection module.

BACKGROUND ART

A fuse is often used for safety protection in a general circuit. For example, Chinese Patent issued publication No. CN203691758U discloses a flexible printed circuit board in which a fusing module is provided in a circuit thereof, the fusing module comprises two or more fusing assemblies which are connected in series, and each of the fusing assemblies comprises a connector and a fusing wire which are connected in parallel, the connector comprises two pads spaced apart from each other. The operating principle of the fusing module is: in order to make one of the fusing assemblies work, the two pads of the connector of the fusing assembly in working are not electrically connected and thus do not form a current conductive path, so that the current flowing through the fusing assembly in working only flow through the fusing wire, and the two pads of the connector of the other of the fusing assemblies which is not in working (as spare) are electrically connected with a soldering tin to form a current conductive path so that the current can flow through the connector of the other of the fusing assemblies. Taking the two fusing assemblies as an example, when the fusing wire of the fusing assembly in working is fused, the repair method is that the two pads of the connector of the fusing assembly in working are electrically connected with the soldering tin to form a current conductive path, and the soldering tin of the connector of the fusing assembly as spare is removed, so that the two pads of the connector of the fusing assembly as spare are not electrically connected, and the current flowing through the fusing assembly as spare only flows through the fusing wire, that is the fusing wire as spare will work.

Due to the fusing assemblies of the aforementioned fusing module are connected in series, and each fusing assembly comprises the connector and the fusing wire which are connected in parallel, it is not only need to occupy more area on the circuit board, but also the connector of the fusing assembly as spare needs to be soldered to form a current conductive path first, and then the soldering tin thereon needs to be removed to form the electrical disconnection when the fusing assembly as spare is to work, which is inconvenient.

SUMMARY

Therefore, one object of the present disclosure is to provide a circuit board, which has a fuse unit with a simple circuit and in which the operation procedure at the time of the repair is more simple and convenient.

Therefore, another object of the present disclosure is to provide a battery connection module, which is used to connect a plurality of batteries arranged side by side.

Accordingly, in some embodiment, a circuit board of the present disclosure comprises an insulating substrate and a plurality of circuit traces provided to the insulating substrate. At least one of the circuit traces is provided with a fuse unit, the fuse unit comprises a main fuse and at least one spare fuse, the main fuse has two main trace connection end portions respectively positioned at two ends of the main fuse and connected to the circuit trace and a main fuse section connected between the two main trace connection end portions, the spare fuse has two trace connection end portions respectively positioned at two ends of the spare fuse and a fuse section connected between the two trace connection end portions, the fuse section and the main fuse section are spaced apart from each other and arranged side by side, and at least one of the two trace connection end portions is not connected with the circuit trace so as to form an electrical disconnection with the circuit trace, and after the main fuse section forms an electrical disconnection, the two trace connection end portions are connected to the circuit trace so that a current conductive path is formed by the spare fuse and the circuit trace.

In some embodiment, one of the trace connection end portions of the spare fuse is connected with one of the main trace connection end portions of the main fuse, and the other trace connection end portion is adjacent to, spaced apart from and thus is not connected with the other main trace connection end portion, after the main fuse section forms the electrical disconnection, the other trace connection end portion and the other the main trace connection end portion which are adjacent to and spaced apart from each other are connected so that the current conductive path is formed by the spare fuse and the circuit trace.

In some embodiment, the other trace connection end portion and the other main trace connection end portion which adjacent to and spaced apart from each other each have an enlarged soldering pad area.

In some embodiment, the fuse unit comprises a plurality of spare fuses, and two of the plurality of spare fuses are defined as a first spare fuse and a second spare fuse, the first spare fuse has two first trace connection end portions respectively positioned at two ends of the first spare fuse and a first fuse section connected between the two first trace connection end portions, the first fuse section and the main fuse section are spaced apart from each other and arranged side by side, the two first trace connection end portions are respectively adjacent to the two main trace connection end portions, and one of the first trace connection end portions and one of the main trace connection end portions which are adjacent to each other are connected, the other first trace connection end portion and the other the main trace connection end portion which are adjacent to each other are spaced apart from each other and are not connected with each other so that the other first trace connection end portion forms an electrical disconnection with the circuit trace, the second spare fuse has two second trace connection end portions respectively positioned at two ends of the second spare fuse and a second fuse section connected between the two second trace connection end portions, the second fuse section and the first fuse section are respectively positioned at two sides of the main fuse section, spaced apart from the main fuse section and arranged side by side with the main fuse section, the two second trace connection end portions are respectively adjacent to the two main trace connection end portions, and one of the second trace connection end portions and one of the main trace connection end portion which are adjacent to each other are connected, and the other second trace connection end portion and the other the main trace connection end portion which are adjacent to each other are spaced from each other so that the other second trace connection end portion forms an electrical disconnection with the circuit trace.

In some embodiment, one of the two main trace connection end portions is connected with the first spare fuse and spaced apart from the second spare fuse, and the other two main trace connection end portion is connected with the second spare fuse and spaced apart from the first spare fuse.

In some embodiment, the fuse section and the main fuse section of the fuse unit are fusing type.

In some embodiment, the insulating substrate is a flexible material.

Accordingly, in some embodiment, a battery connection module of the present disclosure is used to connect a plurality of batteries arranged side by side, the battery connection module comprises an insulating frame used to be provided on the plurality of batteries, a plurality of busbars, a circuit board and a plurality of conductive connecting tabs. The plurality of busbars are provided to the insulating frame, each busbar is used to electrically connect electrodes of at least two adjacent batteries. The circuit board comprises an insulating substrate and a plurality of circuit traces provided to the insulating substrate. Two ends of each conductive connecting tab are respectively connected with the circuit board and one of the busbars, and each conductive connecting tab is connected with one of the circuit traces. The plurality of circuit traces respectively electrically connected to the plurality of conductive connecting tabs each are provided with a fuse unit, the fuse unit comprises a main fuse and at least one spare fuse, the main fuse has two main trace connection end portions respectively positioned at two ends of the main fuse and connected to the corresponding circuit trace and a main fuse section connected between the two main trace connection end portions, the spare fuse has two trace connection end portions respectively positioned at two ends of the spare fuse and a fuse section connected between the two trace connection end portions, the fuse section and the main fuse section are spaced apart from each other and arranged side by side, and at least one of the two trace connection end portions is not connected with the corresponding circuit trace so as to form an electrical disconnection with the corresponding circuit trace, and after the main fuse section forms an electrical disconnection, the two trace connection end portions are connected to the corresponding circuit trace so that a current conductive path is formed by the spare fuse and the corresponding circuit trace.

In some embodiment, one of the trace connection end portions of the spare fuse is connected with one of the main trace connection end portions of the main fuse, and the other trace connection end portion is adjacent to, spaced apart from and thus is not connected with the other main trace connection end portion, after the main fuse section forms the electrical disconnection, the other trace connection end portion and the other the main trace connection end portion which are adjacent to and spaced apart from each other are connected so that the current conductive path is formed by the spare fuse and the corresponding circuit trace.

In some embodiment, the other trace connection end portion and the other main trace connection end portion which adjacent to and spaced apart from each other each have an enlarged soldering pad area.

In some embodiment, the fuse unit comprises a plurality of spare fuses, and two of the plurality of spare fuses are defined as a first spare fuse and a second spare fuse, the first spare fuse has two first trace connection end portions respectively positioned at two ends of the first spare fuse and a first fuse section connected between the two first trace connection end portions, the first fuse section and the main fuse section are spaced apart from each other and arranged side by side, the two first trace connection end portions are respectively adjacent to the two main trace connection end portions, and one of the first trace connection end portions and one of the main trace connection end portions which are adjacent to each other are connected, the other first trace connection end portion and the other the main trace connection end portion which are adjacent to each other are spaced apart from each other and are not connected with each other so that the other first trace connection end portion forms an electrical disconnection with the corresponding circuit trace, the second spare fuse has two second trace connection end portions respectively positioned at two ends of the second spare fuse and a second fuse section connected between the two second trace connection end portions, the second fuse section and the first fuse section are respectively positioned at two sides of the main fuse section, spaced apart from the main fuse section and arranged side by side with the main fuse section, the two second trace connection end portions are respectively adjacent to the two main trace connection end portions, and one of the second trace connection end portions and one of the main trace connection end portion which are adjacent to each other are connected, and the other second trace connection end portion and the other the main trace connection end portion which are adjacent to each other are spaced from each other so that the other second trace connection end portion forms an electrical disconnection with the corresponding circuit trace.

In some embodiment, one of the two main trace connection end portions is connected with the first spare fuse and spaced apart from the second spare fuse, and the other two main trace connection end portion is connected with the second spare fuse and spaced apart from the first spare fuse.

In some embodiment, the fuse section and the main fuse section of the fuse unit are fusing type.

In some embodiment, the insulating substrate is a flexible material.

In some embodiment, the battery connection module further comprises a plurality of auxiliary connecting tabs, two ends of each auxiliary connecting tab are respectively connected with the circuit board and one of the busbars and each auxiliary connecting tab is not connected with any one of the plurality of circuit traces.

In some embodiment, a battery connection module of the present disclosure is used to connect a plurality of batteries arranged side by side, the battery connection module comprises an insulating frame used to be provided on the plurality of batteries, a plurality of busbars, a circuit board, a plurality of conductive connecting tabs and a plurality of auxiliary connecting tabs. The plurality of busbars are provided to the insulating frame, each busbar is used to electrically connect electrodes of at least two adjacent batteries. The circuit board comprises an insulating substrate and a plurality of circuit traces provided to the insulating substrate. Two ends of each conductive connecting tab are respectively connected with the circuit board and one of the busbars, and each conductive connecting tab is connected to one of circuit traces. Two ends of each auxiliary connecting tab are respectively connected with the circuit board and one of the busbars, and each auxiliary connecting tab is not connected with any one of the plurality of circuit traces.

In some embodiment, the plurality of circuit traces respectively electrically connected to the plurality of conductive connecting tabs each are provided with a fuse unit, the fuse unit comprises a main fuse and at least one spare fuse, the main fuse has two main trace connection end portions respectively positioned at two ends of the main fuse and connected to the corresponding circuit trace and a main fuse section connected between the two main trace connection end portions, the spare fuse has two trace connection end portions respectively positioned at two ends of the spare fuse and a fuse section connected between the two trace connection end portions, the fuse section and the main fuse section are spaced apart from each other and arranged side by side, and at least one of the two trace connection end portions is not connected with the corresponding circuit trace so as to form an electrical disconnection with the corresponding circuit trace, and after the main fuse section forms an electrical disconnection, the two trace connection end portions are connected to the corresponding circuit trace so that a current conductive path is formed by the spare fuse and the corresponding circuit trace.

In some embodiment, the insulating frame has a body and a plurality of positioning posts protruding from the body, the insulating substrate of the circuit board has a plurality of positioning holes correspondingly accommodating the plurality of positioning posts, so that the circuit board and the insulating frame are positioned relative to each other.

In some embodiment, the insulating substrate is a flexible material, and the circuit board further comprises a plurality of strengthening tabs provided to the insulating substrate and each strengthening tab correspondingly extends across at least one of the positioning holes in position, and a through hole is formed at a position of each strengthening tab corresponding to the positioning hole to allow the corresponding positioning post to pass through.

In some embodiment, a part of the plurality of busbars each have at least two electrode connecting portions and at least one buffer portion, and one buffer portion is connected between every two adjacent electrode connecting portions, and the at least two electrode connecting portions and the at least one buffer portion are an integral structure.

In some embodiment, a part of the plurality of busbars each have four electrode connecting portions and three buffer portions, and one buffer portion is connected between every two adjacent electrode connecting portions, and the four electrode connecting portions and the three buffer portions are an integral structure.

In some embodiment, the plurality of busbars are used to connect the plurality of batteries in series, in which two busbars which are respectively positioned at two ends of the plurality of batteries connected in series are output electrode members, the battery connection module further comprises an extension connecting tab, the extension connecting tab has a first end and a second end which are positioned at two opposite ends of the extension connecting tab, the first end is connected to one of the output electrode member, the second end and the other output electrode member are positioned at the same side of the insulating frame.

In some embodiment, the battery connection module further comprises a cover covered to the insulating frame to cover the plurality of busbars, the circuit board, the plurality of conductive connecting tabs and the plurality of auxiliary connecting tabs.

The present disclosure at least has the following effect: the area occupied by the fuse unit can be reduced by the simple circuit of the whole fuse unit, and the fuse unit can be repaired when the main fuse is fused so as to save the cost of replacing the circuit board, and the operation procedure at the time of the repair is more simple and convenient. Further, the plurality of spare fuses can be increased according to requirement, the number of repairs can be increased, so as to extend the service life of the circuit board. The connection strength between the busbar and the circuit board can be increased by the auxiliary connecting tab, so as to maintain the stability of electrical connections.

BRIEF DESCRIPTION OF THE DRAWINGS

Other features and effects of the present disclosure will be apparent from the embodiments with reference to figures, in which.

DETAILED DESCRIPTION OF THE PREFERRED EMBODIMENTS

Figure 1:
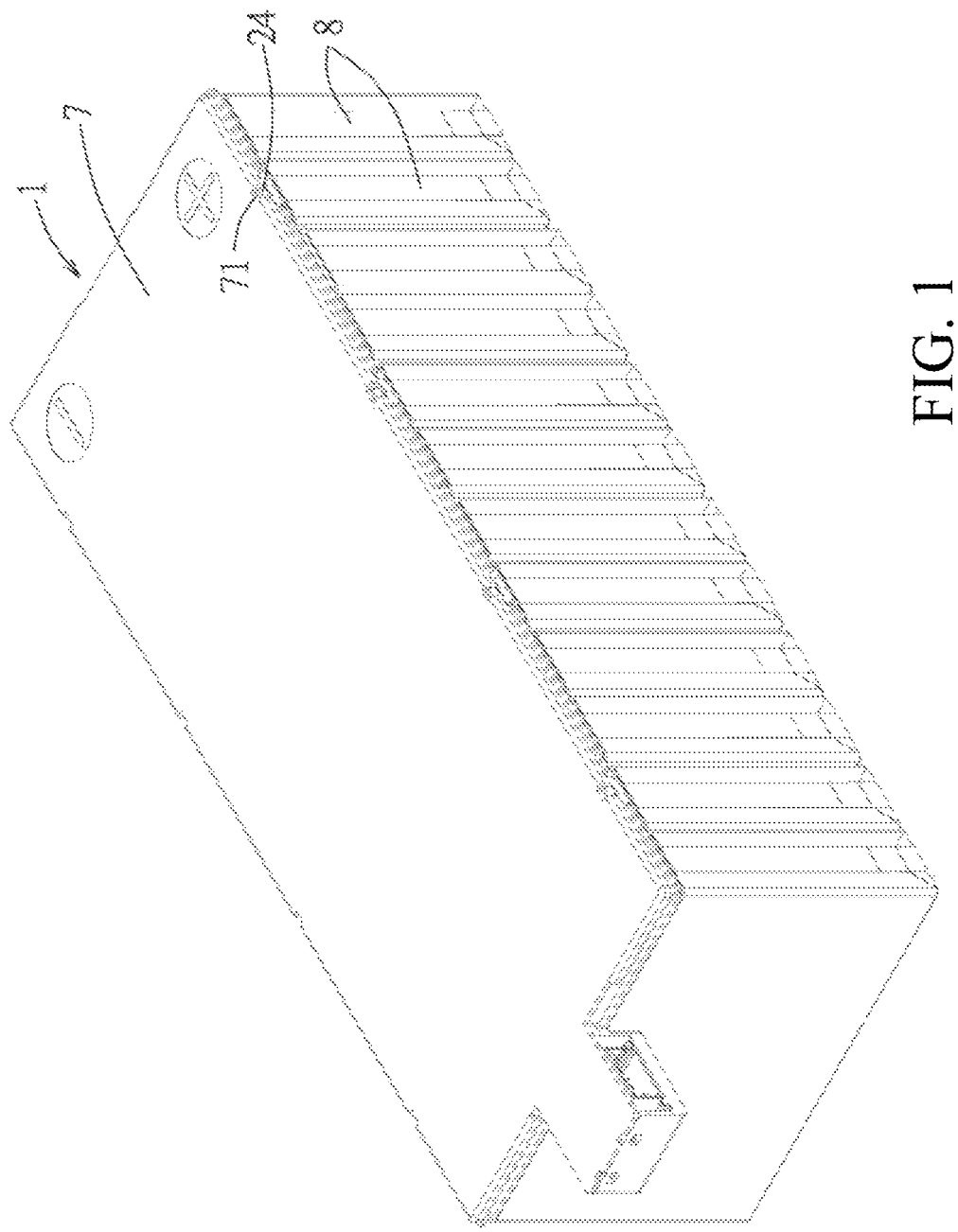
FIG. 1 is a perspective view illustrating a combination of an embodiment of a battery connection module in the present disclosure and a plurality of batteries.

Before the present disclosure is described in detail, it should be noted that like elements are indicated by the same reference numerals in the following description.

Figure 2:
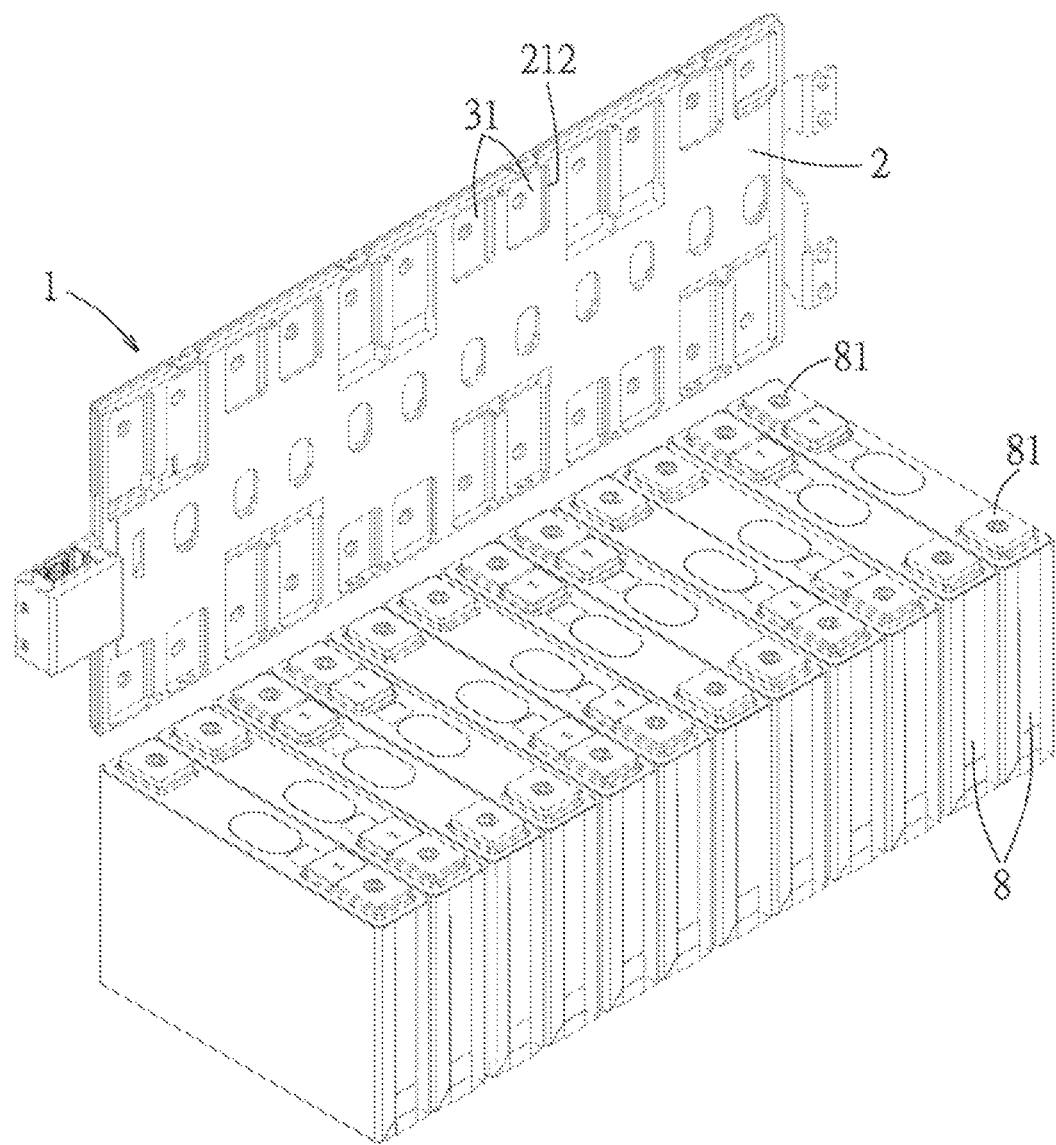
FIG. 2 is an exploded perspective view illustrating an assembling relationship of the embodiment and the plurality of batteries.
Figure 3:
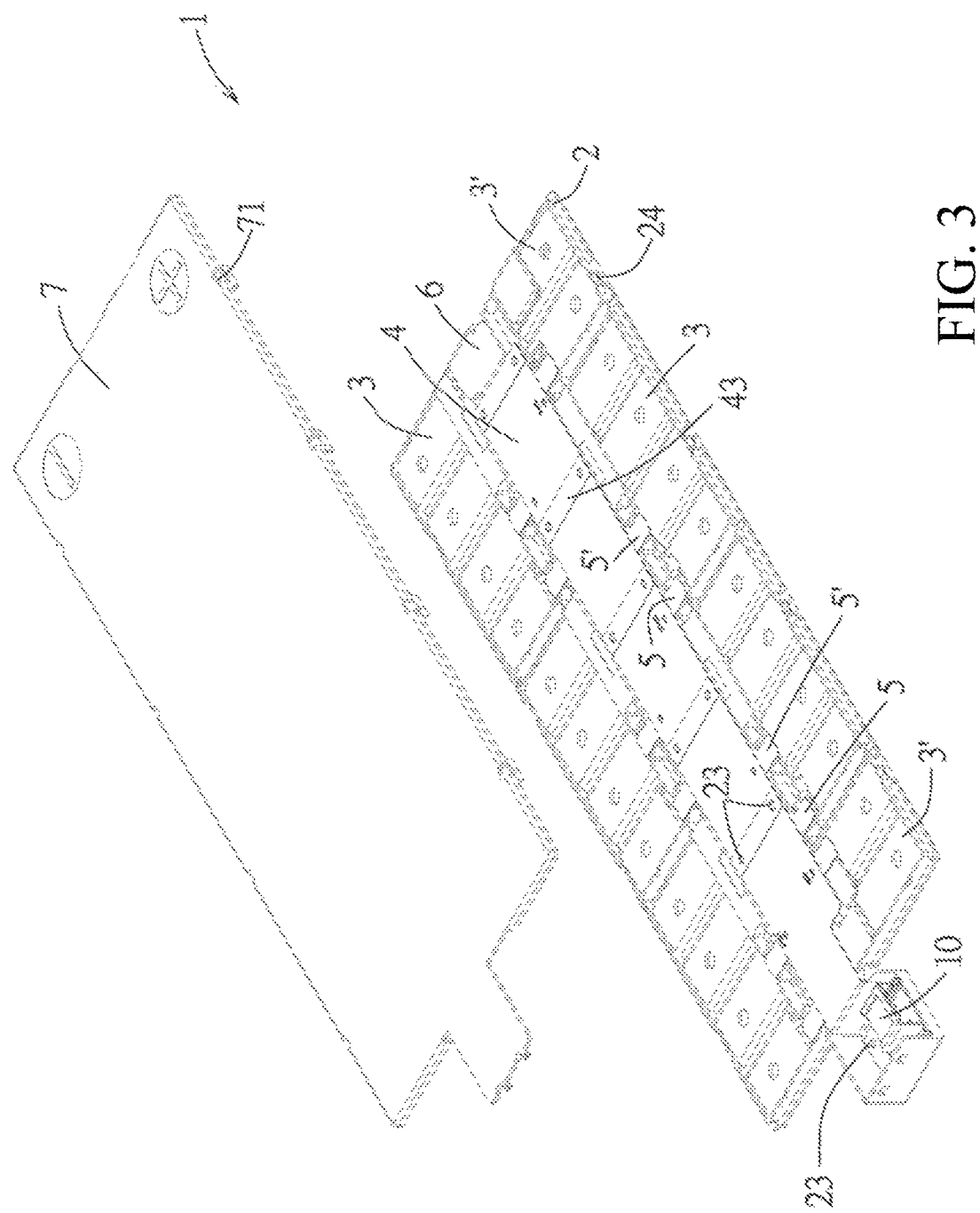
FIG. 3 is an exploded perspective view of the embodiment.
Figure 4:
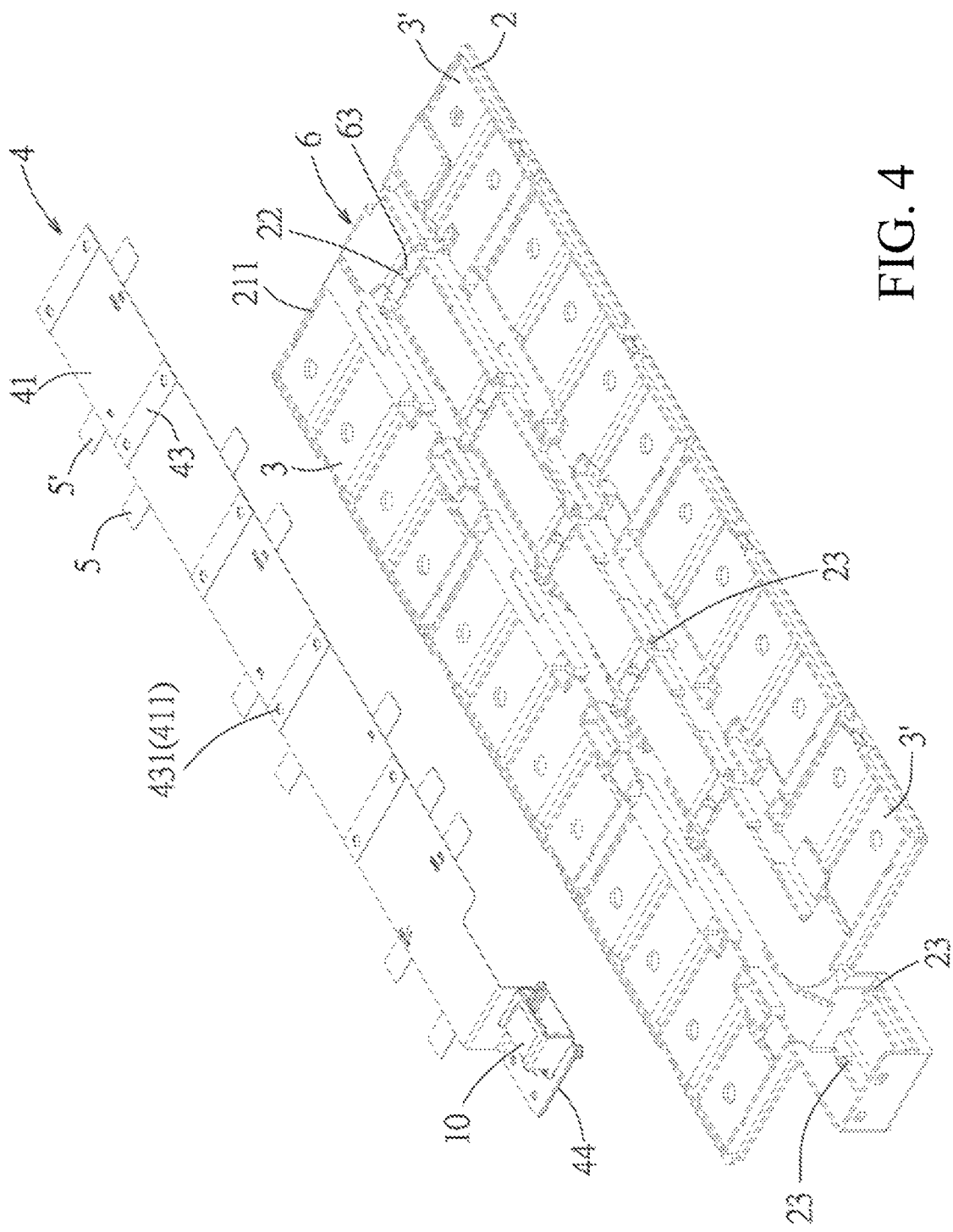
FIG. 4 is an exploded perspective view of the embodiment.

Referring to FIG. 1 and FIG. 2, an embodiment of a battery connection module 1 in the present disclosure is used to connect a plurality of batteries 8 arranged side by side.

Referring to FIG. 2 to FIG. 5, the battery connection module 1 comprises an insulating frame 2, a plurality of busbars 3, a circuit board 4, a plurality of conductive connecting tabs 5, a plurality of auxiliary connecting tabs 5', an extension connecting tab 6 and a cover 7.

The insulating frame 2 is used to be provided on the plurality of batteries 8 and has a body 21, the body 21 is formed with a plurality of accommodating grooves 211 correspondingly accommodating the plurality of busbars 3 and limiting the plurality of busbars 3 in position, and a plurality of hollow portions 212 are formed in each accommodating groove 211. The plurality of busbars 3 are provided to the insulating frame 2 and respectively positioned in the plurality of accommodating grooves 211. Each busbar 3 is used to electrically connect electrodes 81 of at least two adjacent batteries 8. The plurality of busbars 3 are used to connect the plurality of batteries 8 in series, in which two busbars 3 which are respectively positioned at two ends of the plurality of batteries connected in series are output electrode members 3'. A part of the plurality of busbars 3 each have at least two electrode connecting portions 31 and at least one buffer portion 32, so that one buffer portion 32 is connected between every two adjacent electrode connecting portions 31 and the at least two electrode connecting portions 31 and the at least one buffer portion 32 are an integral structure. In the embodiment, except the two output electrode members 3', the other busbars 3 each have four electrode connecting portions 31 and three buffer portions 32, so that one buffer portion 32 is connected between every two adjacent electrode connecting portions 31 and the four electrode connecting portions 31 and the three buffer portions 32 are an integral structure, but each output electrode member 3' has two electrode connecting portions 31 and one buffer portion 32 connected between the two electrode connecting portions 31. Each electrode connecting portion 31 is provided corresponding to one hollow portion 212, and the electrode connecting portions 31 can be exposed to a bottom surface of the insulating frame 2 so as to contact the electrode 81 (generally is the positive electrode or the negative electrode) of the battery 8.

In the embodiment, the plurality of busbars 3, 3' make the plurality of batteries 8 connected in series in a manner that every two batteries 8 are connected in parallel first and then the every two batteries 8 which have been connected in parallel are further connected in series. The plurality of busbars 3 are arranged in two rows which are spaced apart from each other and arranged side by side, the two output electrode members 3' are positioned at two ends of the same row for connecting with external wires (not shown). In the embodiment, an extension connecting tab 6 is additionally provided, the extension connecting tab 6 is positioned in a space between the two rows of busbars 3 which are spaced apart from each other, and has a first end 61 and a second end 62 which are positioned at two opposite ends respectively, the first end 61 is connected to one of the output electrode members 3', the second end 62 and the other output electrode member 3' are positioned at the same side of the insulating frame 2. That is, the insulating frame 2 is rectangular in shape, the two output electrode members 3' are positioned at positions respectively adjacent to two short sides of the insulating frame 2, a position of extension connecting tab 6 and a position of the other output electrode member 3' to be connected to the external wire (not shown) can be positioned at the same short side of the insulating frame 2 by that the extension connecting tab 6 is connected to one of the output electrode members 3', so that it is convenient to connect the two output electrode members 3' with the external wires. Moreover, in the embodiment, the insulating frame 2 further has a plurality of protruding posts 22 protruding from the body 21, and a plurality of fixing holes 63 are formed in the extension connecting tab 6 to respectively allow the plurality of protruding posts 22 to pass through. In an embodiment, an end of each of the plurality of protruding posts 22 passing through the fixing holes 63 can be hot-melted and becomes an enlarged head so as to further fix the extension connecting tab 6.

Figure 6:
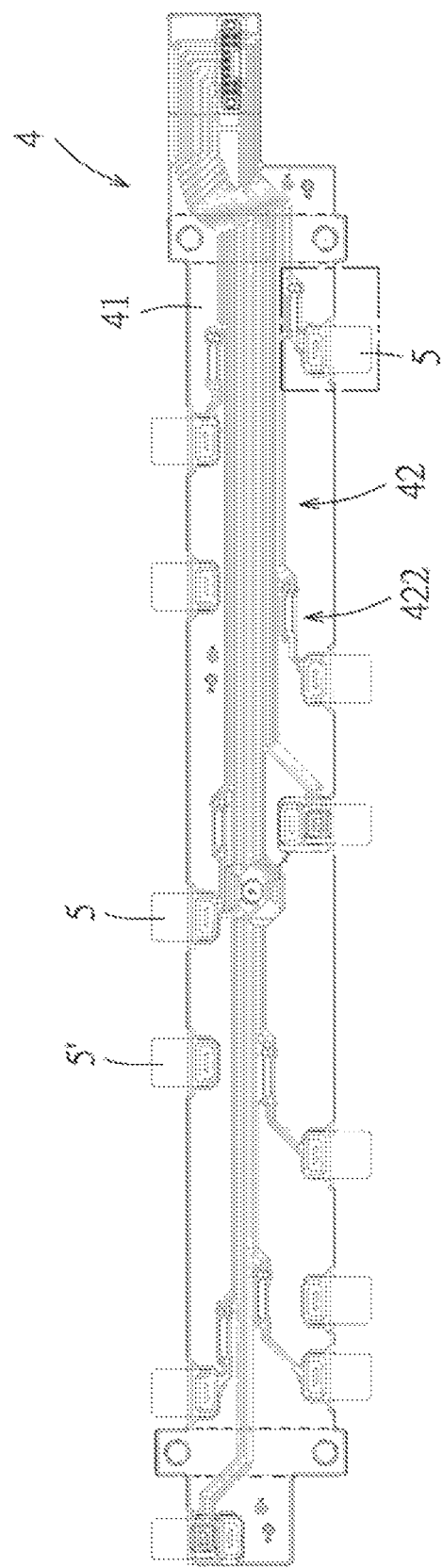
FIG. 6 is a diagram illustrating a circuit layout of a circuit board of the embodiment.
Figure 7:
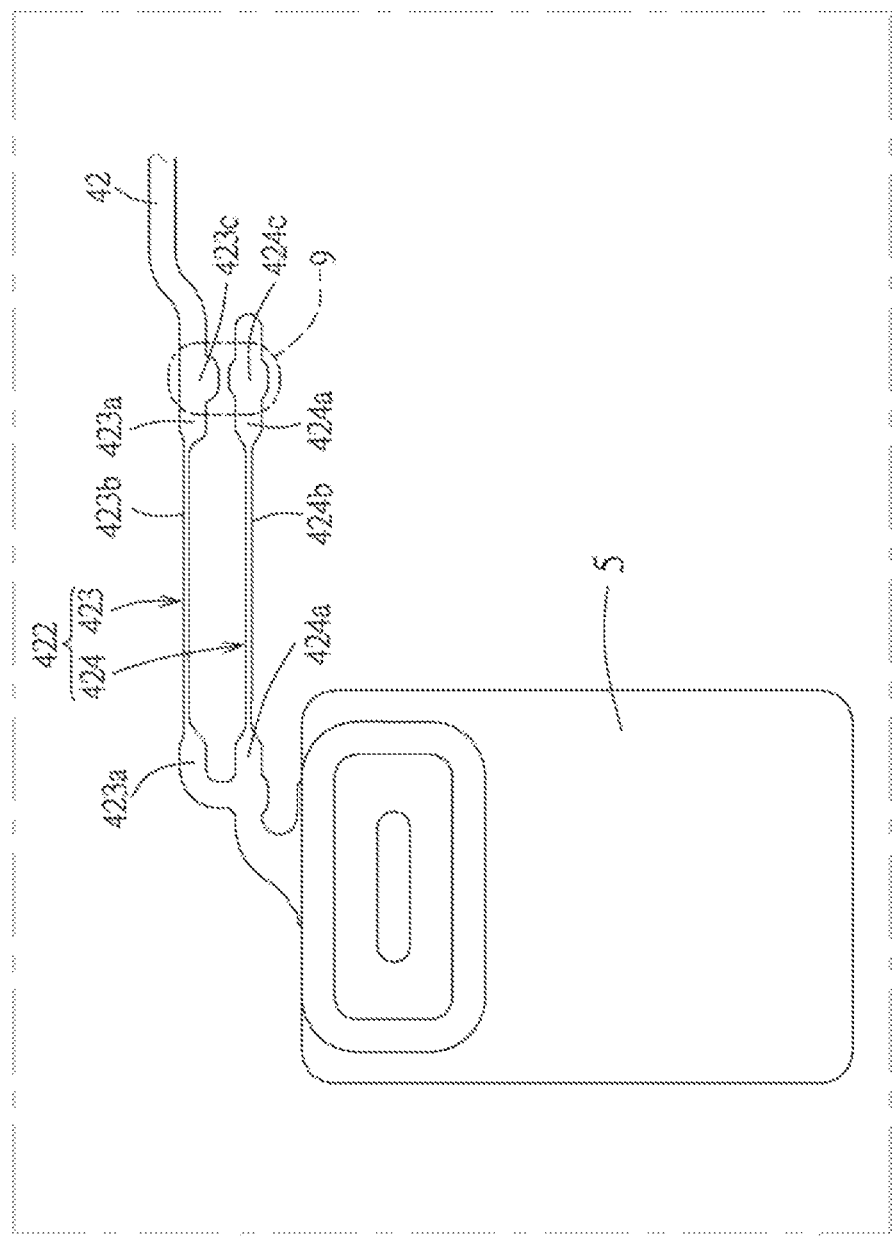
FIG. 7 is a partially enlarged view of FIG. 6 with only part associated with a fuse unit depicted.

Referring to FIG. 6 and FIG. 7, the circuit board 4 comprises an insulating substrate 41 and a plurality of circuit traces 42 provided to the insulating substrate 41, in which at least one of the circuit traces 42 is provided with a fuse unit 422. In the embodiment, the plurality of circuit traces 42 respectively electrically connected with the plurality of conductive connecting tabs 5 each are provided with a fuse unit 422. The fuse unit 422 comprises a main fuse 423 and a first spare fuse 424. The main fuse 423 has two main trace connection end portions 423a respectively positioned at two ends of the main fuse 423 and connected to the circuit trace 42 and a main fuse section 423b connected between two main trace connection end portions 423a, the first spare fuse 424 has two first trace connection end portions 424a respectively positioned at two ends of the first spare fuse 424 and a first fuse section 424b connected between the two first trace connection end portions 424a. The first fuse section 424b and the main fuse section 423b are spaced apart from each other and arranged side by side, the two first trace connection end portions 424a are respectively adjacent to the two main trace connection end portions 423a, and at least one of the two first trace connection end portions 424a is not connected with the corresponding circuit trace 42 so as to form an electrical disconnection with the circuit trace 42, and after the main fuse section 423b forms an electrical disconnection, the two first trace connection end portions 424a are connected to the circuit trace 42 so that a current conductive path is formed by the first spare fuse 424 and the circuit trace 42. In the embodiment, one of the two first trace connection end portions 424a of the first spare fuse 424 is connected with one of the two main trace connection end portion 423a of the main fuse 423, and the other first trace connection end portion 424a is adjacent to, spaced apart from and thus is not connected with the other main trace connection end portion 423a, the other first trace connection end portion 424a and the other main trace connection end portion 423a which are adjacent to and spaced apart from each other each have an enlarged soldering pad area 423c, 424c so that the other first trace connection end portion 424a and the other main trace connection end portion 423a adjacent to and spaced apart from each other are connected via the two soldering pad areas 423c, 424c after the main fuse section 423b forms the electrical disconnection, that is, the two soldering pad areas 423c, 424c can be connected with a solder 9 by a soldering method, so that a current conductive path is formed by the first spare fuse 424 and the circuit trace 42. So, after the main fuse 423 forms an electrical disconnection, the first spare fuse 424 is enabled to start work as long as the first trace connection end portion 424a and the main trace connection end portion 423a which are adjacent to and spaced apart from each other are connected, so as to extend the service life of the circuit board 4, simplify the repair procedure, and save the cost of replacing the circuit board 4. In the embodiment, the insulating substrate 41 is a flexible material, that is, the circuit board 4 is a flexible circuit board, and both the main fuse section 423b and the first fuse section 424b of the fuse unit 422 are fusing type fuses.

Figure 8:
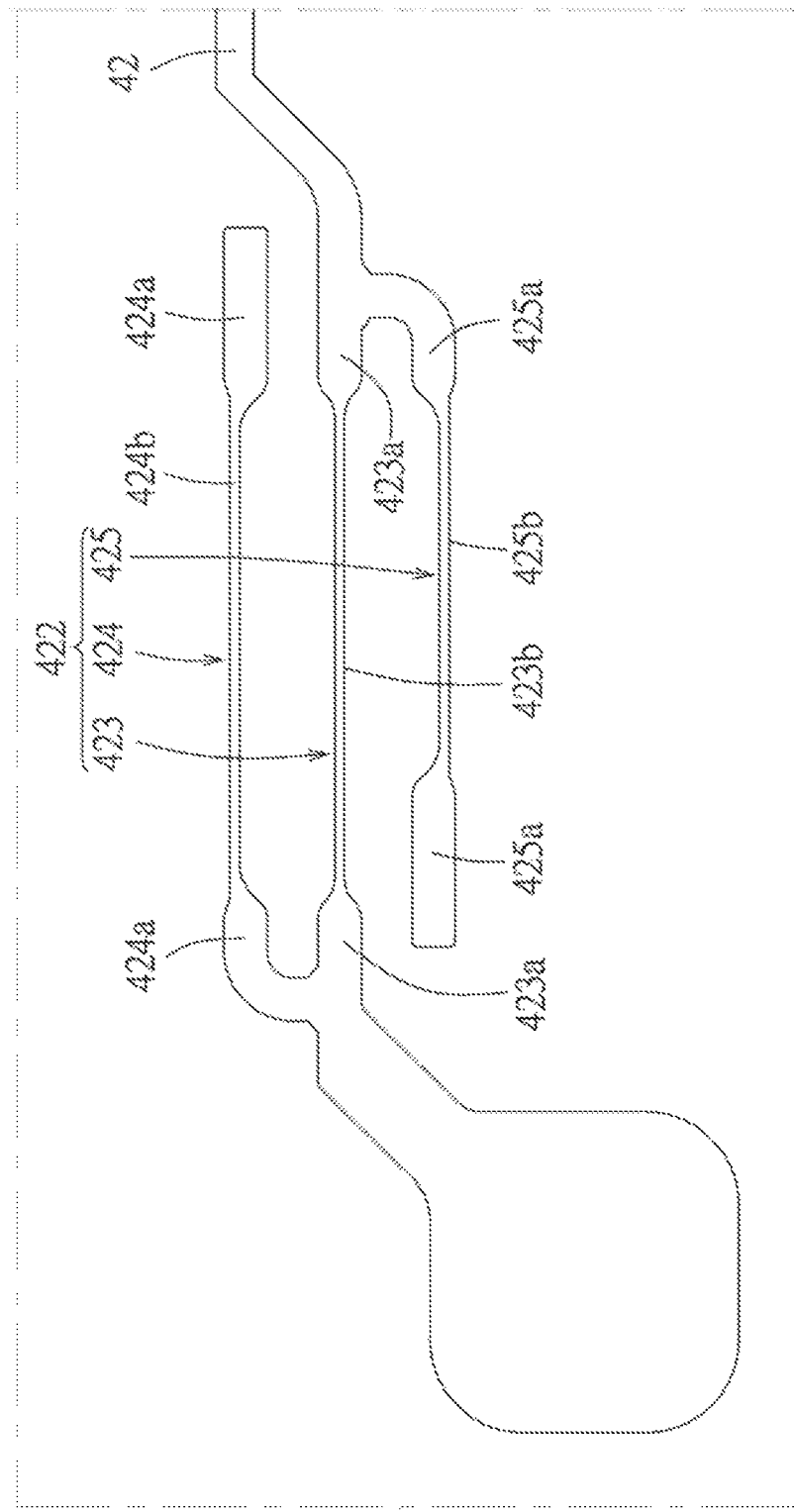
FIG. 8 is a diagram illustrating a circuit layout of another embodiment of the fuse unit of the embodiment.

Additionally referring to FIG. 8, in a varied embodiment, the fuse unit 422 further comprises a second spare fuse 425, the second spare fuse 425 has two second trace connection end portions 425a respectively positioned at two ends of the second spare fuse 425 and a second fuse section 425b connected between the two second trace connection end portions 425a, the second fuse section 425b and the first fuse section 424b are respectively positioned at two sides of the main fuse section 423b and spaced apart from the main fuse section 423b and arranged side by side with the main fuse section 423b, the two second trace connection end portions 425a are respectively adjacent to the two main trace connection end portions 423a, and one of the second trace connection end portions 425a and one of the main trace connection end portions 423a are adjacent to each other and are connected, and the other second trace connection end portion 425a and the other the main trace connection end portion 423a are adjacent to each other and spaced apart from each other so that the other second trace connection end portion 425a forms an electrical disconnection with the circuit trace 42. Preferably, one of the two main trace connection end portions 423a is connected with the first spare fuse 424 and spaced apart from the second spare fuse 425 and the other main trace connection end portion 423a is connected with the second spare fuse 425 and spaced apart from the first spare fuse 424. However, in another varied embodiment, the same main trace connection end portion 423a may be connected with both the first spare fuse 424 and the second spare fuse 425, and the other main trace connection end portion 423a is spaced from both the first spare fuse 424 and the second spare fuse 425 at the same time. One more chance of repair can be added by additionally providing the second spare fuse 425, and according to the varied embodiment, it can be understood that, the spare fuse is not limited to two in number, it can be increased more than two according to actual demand, for example, a third spare fuse, a fourth spare fuse and so on, can be added, that is, the spare fuse can be provided as at least one in number, can also be provided as more than one in number, it is not limited to the embodiment. In the embodiment, the main fuse 423, the first spare fuse 424, the second spare fuse 425 are arranged side by side, an area occupied by the fuse unit can be reduced, and the circuit of the whole fuse unit 422 is simple, and the operation procedure at repair is more simple.

Figure 5:
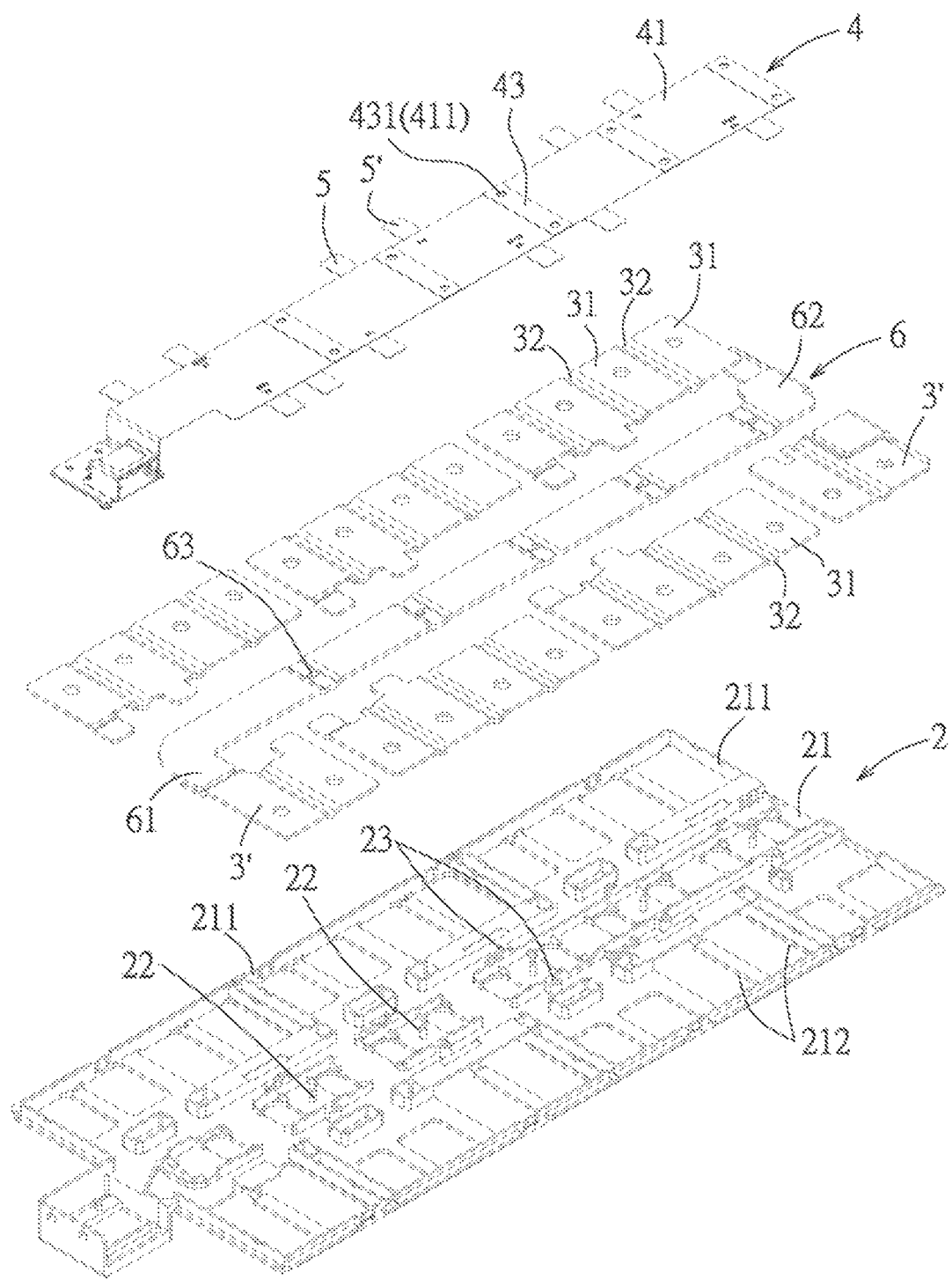
FIG. 5 is an exploded perspective view of the embodiment.
Figure 9:
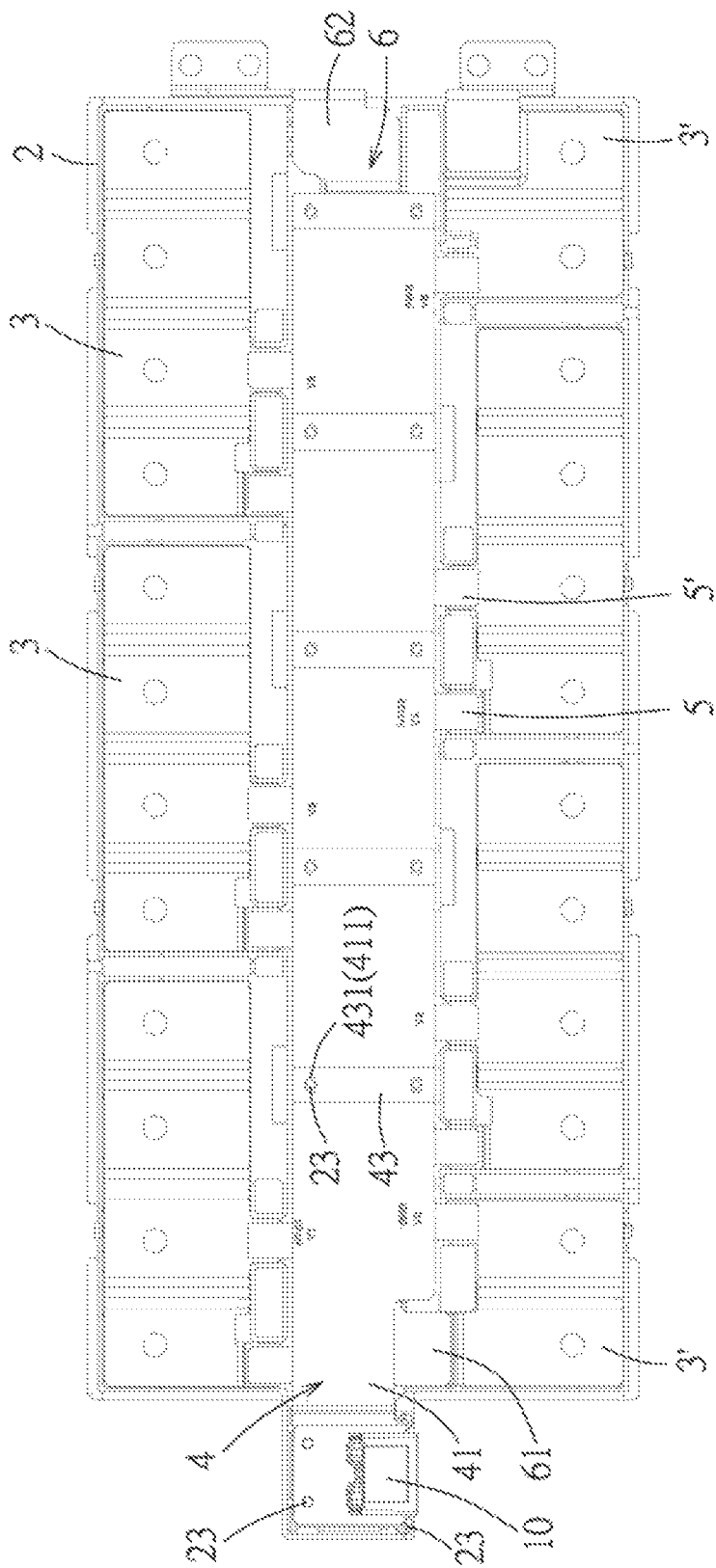
FIG. 9 is a top view of the embodiment with a cover removed.
Figure 10:
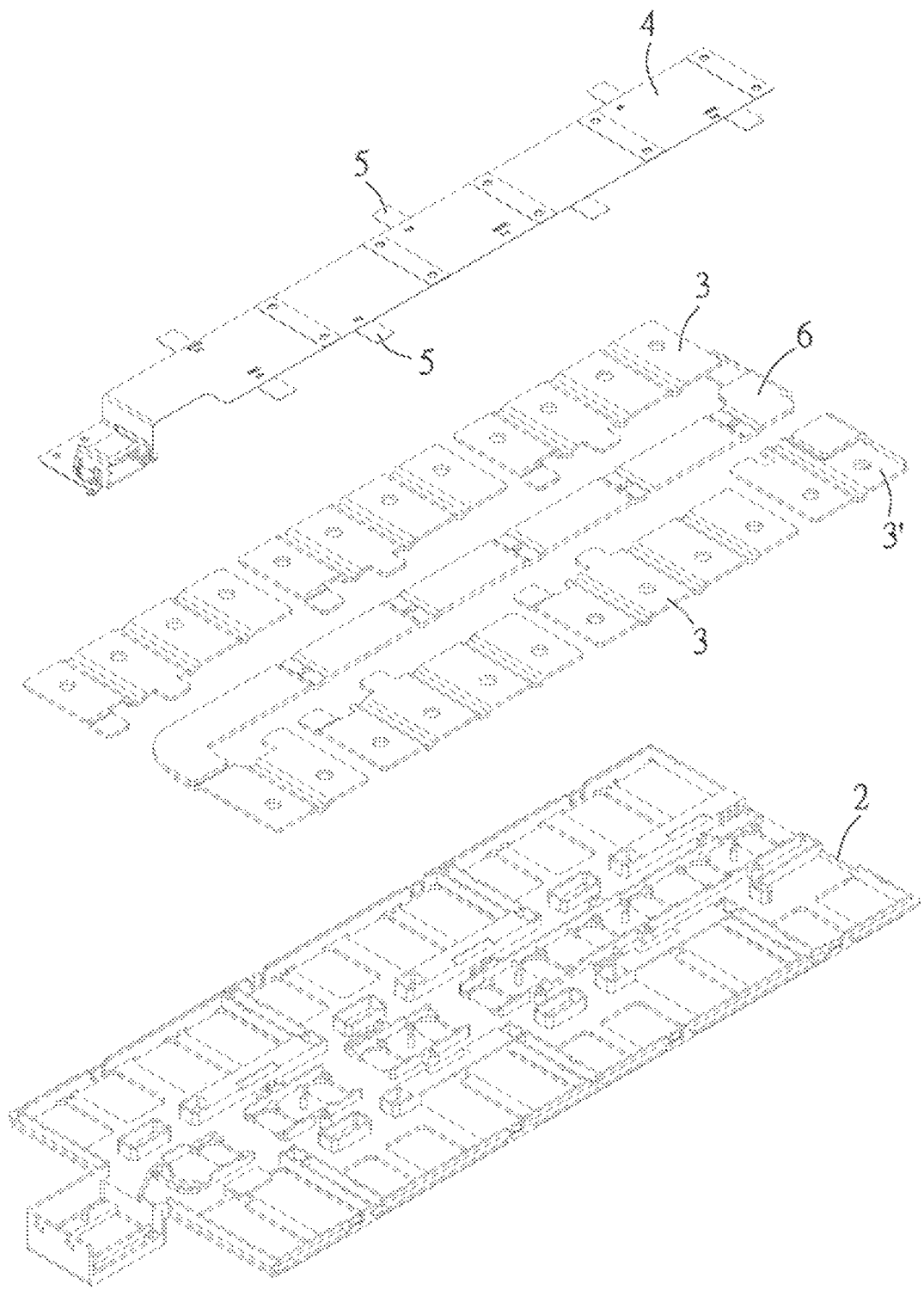
FIG. 10 and FIG. 11 are an exploded perspective view and a top view illustrating varied embodiments of a plurality of conductive connecting tabs of the embodiment.
Figure 11:
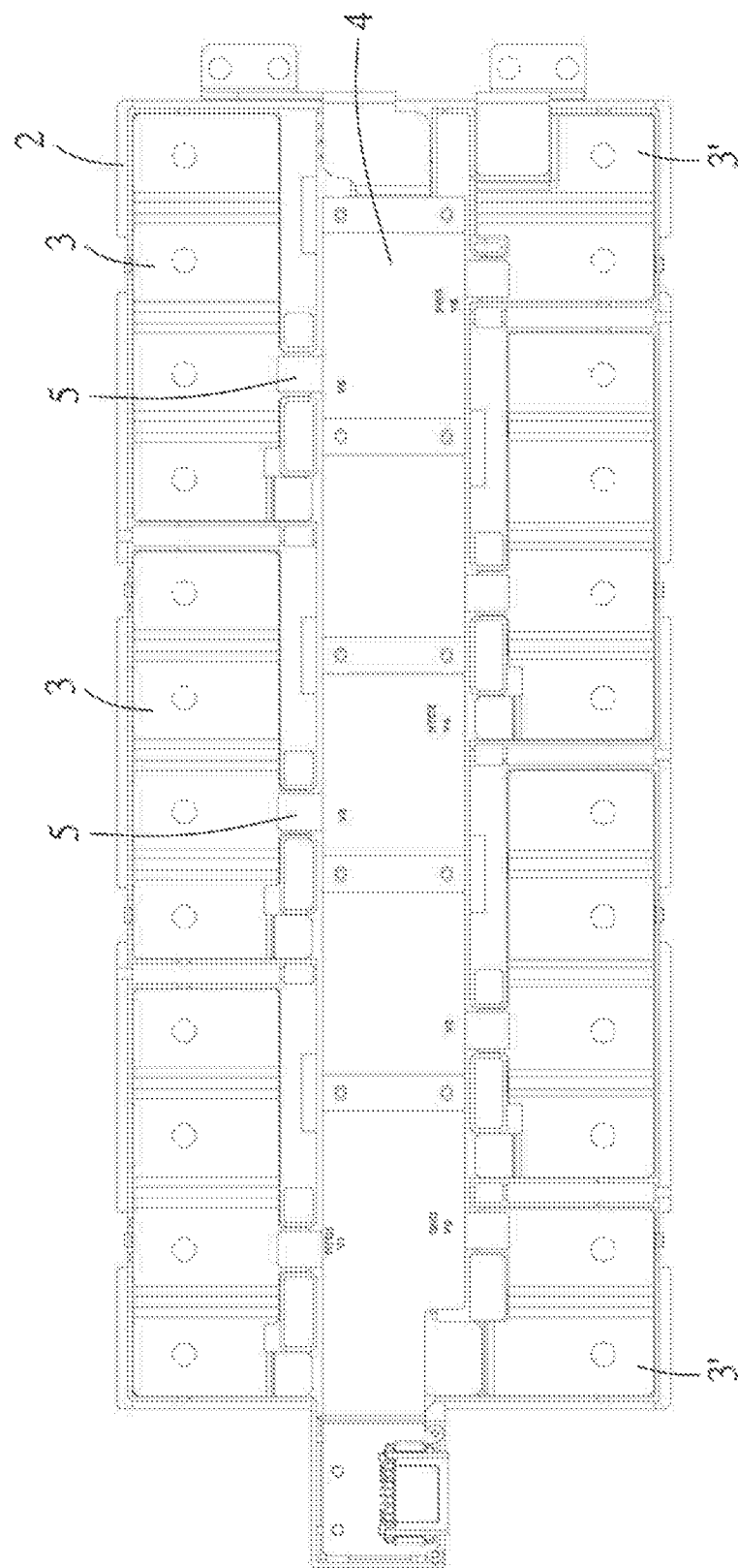

Referring to FIG. 5, FIG. 6 and FIG. 9, two ends of each conductive connecting tab 5 are respectively connected with the circuit board 4 and one of the busbars 3, and each conductive connecting tab 5 is connected with one of the circuit traces 42. Two ends of each auxiliary connecting tab 5' are respectively connected with the circuit board 4 and one of the busbars 3, and each auxiliary connecting tab 5' is not connected with any one of the plurality of circuit traces 42. The connection strength between the busbar 3 and the circuit board 4 can be increased by the auxiliary connecting tab 5' so as to maintain the stability of electrical connection. Certainly, referring to FIG. 10 and FIG. 11, in a varied embodiment, it can also be implemented as the busbar 3 is only connected to the conductive connecting tab 5.

Referring to FIG. 5 and FIG. 9 again, in the embodiment, the insulating frame 2 further has a plurality of positioning posts 23 protruding from the body 21, the insulating substrate 41 of the circuit board 4 has a plurality of positioning holes 411 correspondingly accommodating the plurality of positioning posts 23, so that the circuit board 4 and the insulating frame 2 are positioned relative to each other. And the circuit board 4 further comprises a plurality of strengthening tabs 43 provided to the insulating substrate 41 and each strengthening tab 43 correspondingly extends across at least one of the positioning holes 411 in position, and a through hole 431 is formed at a position of each strengthening tab 43 corresponding to the positioning hole 411 to allow the corresponding positioning post 23 to pass through. Specifically, in the embodiment, each strengthening tab 43 is transversally provided to the insulating substrate 41, and is formed with two through holes 431 to respectively correspond to the two positioning holes 411 and the two positioning posts 23. The circuit board 4 and the insulating frame 2 are positioned relative to each other by the positioning hole 411 and the positioning post 23, and the strength of the insulating substrate 41 at the position where the positioning hole 411 is provided is increased by the strengthening tab 43. After the plurality of positioning posts 23 pass through the positioning holes 411 (the through holes 431) respectively, an end of each of the plurality of positioning posts 23 may be formed as an enlarged head using hot-melt so as to strengthen the fixed effect. Also referring to FIG. 4, in the embodiment, an electrical connector 10 is provided on the circuit board 4 used to externally connect with a plug (not shown), and the circuit board 4 further comprises a strengthening back plate 44 provided to the insulating substrate 41, the strengthening back plate 44 and the electrical connector 10 are respectively positioned on two opposite sides of the insulating substrate 41.

Referring to FIG. 1 and FIG. 3 again, the cover 7 is covered to the insulating frame 2 so as to cover the plurality of busbars 3, the circuit board 4, the plurality of conductive connecting tabs 5, the plurality of auxiliary connecting tabs 5' and the extension connecting tab 6. A periphery of the cover 7 is formed with a plurality of latching holes 71, a periphery of the insulating frames 2 is formed with a plurality of latching protrusions 24 corresponding to the plurality of latching holes 71 respectively, the cover 7 and the insulating frame 2 are positioned relative to each other by that the plurality of latching protrusions 24 are respectively latched with the plurality of latching holes 71.

In conclusion, the area occupied by the fuse unit 422 can be reduced by the simple circuit of the whole fuse unit 422, and the fuse unit 422 can be repaired when the main fuse 423 is fused so as to save the cost of replacing circuit board 4, and the operation procedure at the time of the repair is more simple and convenient. Further, the plurality of spare fuses can be increased according to requirement, the number of repairs can be increased, so as to extend the service life of the circuit board 4. The connection strength between the busbar 3 and the circuit board 4 can be increased by the auxiliary connecting tab 5', so as to maintain the stability of electrical connections.

The above contents are merely embodiments of the present disclosure and the scope of implementing the present disclosure cannot be limited to those. Any simple equivalent changes and modifications made according to the scope of the claims and the contents of the specification of the present disclosure are fallen within the scope of the present disclosure.

What is claimed is:

1. A battery connection module used to connect a plurality of batteries arranged side by side, the battery connection module comprising:
    an insulating frame configured to house the plurality of batteries;
    a conductive busbar on the insulating frame, the busbar being configured to electrically connect electrodes of at least two adjacent batteries;
    a circuit board comprising an insulating substrate and a conductive circuit trace on the insulating substrate;
    a conductive connecting tab extending from the circuit board and electrically coupled with the trace on the circuit board, wherein the conductive connecting tab further overlays, and is electrically coupled with, the busbar; and
    a fuse unit comprising a main fuse and a spare fuse, the main fuse having a main fuse section and first and second main trace connection end portions at opposite first and second ends of the main fuse section, the spare fuse having a spare fuse section and first and second spare trace connection end portions at opposite first and second ends of the spare fuse section, wherein the first main trace connection end and the first spare trace connection end are electrically connected to the conductive connecting tab, the main fuse section and the spare fuse section being spaced apart from each other and arranged side by side, wherein the second main trace connection end portion is electrically connected with the circuit trace and the second spare trace connection end portion is not electrically connected with the circuit trace in a first condition, and wherein the second spare trace connection end portion is electrically connected with the circuit trace and the second main trace connection end portion is not electrically connected with the circuit trace in a second condition, and wherein a plurality of the conductive circuit traces are provided on the insulating substrate, and a plurality of the busbars are provided and coupled with individual ones of the circuit traces by a respective fuse unit.

2. The battery connection module of claim 1, wherein in each fuse unit the first spare trace connection end portion is connected with the first main trace connection end portion.

3. The battery connection module of claim 2, wherein in each fuse unit the second main trace connection end portion and the second spare trace connection end portion are adjacent to each other and are spaced apart from each other, and each of the second main trace connection end portion and the second spare trace connection end portion has an enlarged soldering pad area.

4. The battery connection module of claim 1, wherein the spare fuse of each fuse unit is a first spare fuse, and wherein each fuse unit further comprises a second spare fuse, each second spare fuse having a spare fuse section and first and second spare trace connection end portions at opposite first and second ends thereof, the spare fuse section of the first spare fuse and the spare fuse section of the second spare fuse are on opposite sides of the main fuse section, are spaced apart from the main fuse section and are arranged side by side with the main fuse section, wherein the second main trace connection end of the second spare fuse and the second spare trace connection end are electrically connected to each other, wherein the first spare trace connection end portion of the second spare fuse is not electrically connected with the conductive connecting tab in the first and second conditions, and wherein the first spare trace connection end portion of the second spare fuse is electrically connected with the conductive connecting tab in a third condition.

5. The battery connection module of claim 1, wherein the insulating substrate is a flexible material.

6. The battery connection module of claim 5, further comprising a plurality of auxiliary connecting tabs, each auxiliary connecting tab extending from the circuit board and connected with a respective one of the busbars, wherein each auxiliary connecting tab is not electrically connected with any one of the circuit traces.

7. A battery connection module used to connect a plurality of batteries arranged side by side, the battery connection module comprising:
an insulating frame configured to house the plurality of batteries;
a plurality of conductive busbars on the insulating frame, each busbar being configured to electrically connect electrodes of at least two adjacent batteries;
a circuit board comprising an insulating substrate and a plurality of conductive circuit traces on the insulating substrate;
a plurality of conductive connecting tabs extending from the circuit board and electrically coupled with a respective trace on the circuit board and, wherein respective conductive connecting tabs further overlay, and is electrically coupled with, respective ones of the busbars; and
a plurality of auxiliary connecting tabs extending from the circuit board and connected with respective ones of the busbars, and each auxiliary connecting tab not being electrically connected with any one of the plurality of circuit traces.

8. The battery connection module of claim 7, wherein the insulating frame has a body and a plurality of positioning posts protruding from the body, the insulating substrate of the circuit board has a plurality of positioning holes correspondingly accommodating the plurality of positioning posts.

9. The battery connection module of claim 8, wherein the insulating substrate is a flexible material, and the circuit board further comprises a plurality of strengthening tabs on the insulating substrate and each strengthening tab correspondingly extends across at least one of the positioning holes in position, and a through hole is formed at a position of each strengthening tab corresponding to the positioning hole to allow the corresponding positioning post to pass through.

10. The battery connection module of claim 7, wherein each busbar has two electrode connecting portions and a buffer portion therebetween, and the electrode connecting portions and the buffer portion are an integral structure.

11. The battery connection module of claim 7, wherein each busbar has four electrode connecting portions and three buffer portions, and one buffer portion is connected between every two adjacent electrode connecting portions, and the four electrode connecting portions and the three buffer portions are an integral structure.

12. The battery connection module of claim 7, wherein the plurality of busbars are used to connect the plurality of batteries in series, in which two busbars which are respectively positioned at two opposite ends of the plurality of batteries connected in series are output electrode members, the battery connection module further comprises an extension connecting tab, the extension connecting tab having a first end and a second opposite end, the first end of the extension connecting tab is connected to one of the output electrode members, the second end of the extension connecting tab and the other output electrode member are positioned at a same side of the insulating frame.

13. The battery connection module of claim 7, further comprising a cover on the insulating frame which covers the busbars, the circuit board, the conductive connecting tabs and the auxiliary connecting tabs.

14. The battery connection module of claim 1, further comprising a cover on the insulating frame which covers the busbars, the circuit board, and the conductive connecting tabs.

15. The battery connection module of claim 6, further comprising a cover on the insulating frame which covers the busbars, the circuit board, the conductive connecting tabs, and the auxiliary connecting tabs.

16. The battery connection module of claim 1, further comprising a plurality of auxiliary connecting tabs, each auxiliary connecting tab extending from the circuit board and connected with a respective one of the busbars, wherein each auxiliary connecting tab is not electrically connected with any one of the circuit traces.

* * * * *